(12) United States Patent
Gould et al.

(10) Patent No.: US 10,672,957 B2
(45) Date of Patent: Jun. 2, 2020

(54) LED APPARATUSES AND METHODS FOR HIGH LUMEN OUTPUT DENSITY

(71) Applicant: Cree, Inc., Durham, NC (US)

(72) Inventors: Troy Gould, Raleigh, NC (US); Colin Kelly Blakely, Franklintown, NC (US); Jesse Colin Reiherzer, Raleigh, NC (US); Craig William Hardin, Apex, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/654,323

(22) Filed: Jul. 19, 2017

(65) Prior Publication Data

US 2019/0027658 A1  Jan. 24, 2019

(51) Int. Cl.
*H01L 33/54* (2010.01)
*H01L 33/00* (2010.01)
*H01L 25/075* (2006.01)

(52) U.S. Cl.
CPC ............ *H01L 33/54* (2013.01); *H01L 33/005* (2013.01); *H01L 25/0753* (2013.01); *H01L 2933/005* (2013.01)

(58) Field of Classification Search
CPC .......... H01L 33/50–56; H01L 25/0753; H01L 2933/005; H01L 33/005; H01L 33/54
See application file for complete search history.

(56) References Cited

U.S. PATENT DOCUMENTS

| | | | |
|---|---|---|---|
| 4,918,497 A | 4/1990 | Edmond | |
| 4,946,547 A | 8/1990 | Palmour et al. | |
| 4,966,862 A | 10/1990 | Edmond | |
| 5,027,168 A | 6/1991 | Edmond | |
| 5,200,022 A | 4/1993 | Kong et al. | |
| 5,210,051 A | 5/1993 | Carter, Jr. | |
| 5,338,944 A | 8/1994 | Edmond et al. | |
| 5,359,345 A | 10/1994 | Hunter | |
| RE34,861 E | 2/1995 | Davis et al. | |
| 5,393,993 A | 2/1995 | Edmond et al. | |
| 5,416,342 A | 5/1995 | Edmond et al. | |
| 5,523,589 A | 6/1996 | Edmond et al. | |

(Continued)

FOREIGN PATENT DOCUMENTS

| | | |
|---|---|---|
| EP | 2472578 A2 | 7/2012 |
| EP | 2811517 A1 | 12/2014 |

(Continued)

OTHER PUBLICATIONS

International Search Report and Written Opinion for Application No. PCT/US2013/034084 dated Jul. 25, 2013.

(Continued)

*Primary Examiner* — Duy T Nguyen

(74) *Attorney, Agent, or Firm* — Jenkins, Wilson, Taylor & Hunt P.A.

(57) ABSTRACT

Light emitting diode (LED) apparatuses and methods having a high lumen output density. An example apparatus can include a substrate with one or more LEDs enclosed by an encapsulant. The encapsulant comprises beveled edges and/or top surface facets. By providing facets in the encapsulant and minimizing the chip-to-area ratio through efficient via placement, a high lumen density is achieved. Facets and bevels can be created by removing material from the encapsulant with a beveled blade.

15 Claims, 6 Drawing Sheets

(56) References Cited

U.S. PATENT DOCUMENTS

| | | | |
|---|---|---|---|
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |
| 6,120,600 A | 9/2000 | Edmond et al. |
| 6,187,606 B1 | 2/2001 | Edmond et al. |
| 6,201,262 B1 | 3/2001 | Edmond et al. |
| 6,600,175 B1 | 7/2003 | Baretz et al. |
| 6,791,119 B2 | 9/2004 | Slater, Jr. et al. |
| 6,853,010 B2 | 2/2005 | Slater, Jr. et al. |
| 6,958,497 B2 | 10/2005 | Emerson et al. |
| 7,095,056 B2 | 8/2006 | Vitta et al. |
| 7,213,940 B1 | 5/2007 | Van De Ven et al. |
| 7,256,486 B2 | 8/2007 | Lee et al. |
| 7,279,355 B2 | 10/2007 | Lee et al. |
| 7,456,499 B2 | 11/2008 | Loh et al. |
| 7,564,180 B2 | 7/2009 | Brandes |
| 7,655,957 B2 | 2/2010 | Loh et al. |
| 7,791,061 B2 | 9/2010 | Edmond et al. |
| 7,802,901 B2 | 9/2010 | McMillan |
| 7,821,023 B2 | 10/2010 | Yuan et al. |
| 7,919,787 B2 | 4/2011 | Lee et al. |
| 7,952,544 B2 | 5/2011 | Roberts |
| 7,960,819 B2 | 6/2011 | Loh et al. |
| 7,999,283 B2 | 8/2011 | Chakraborty et al. |
| 8,018,135 B2 | 9/2011 | Van De Ven et al. |
| 8,044,418 B2 | 10/2011 | Loh et al. |
| 8,058,088 B2 | 11/2011 | Cannon et al. |
| 8,125,137 B2 | 2/2012 | Medendorp, Jr. et al. |
| 8,264,138 B2 | 9/2012 | Negley et al. |
| 8,337,071 B2 | 12/2012 | Negley et al. |
| 8,563,339 B2 | 10/2013 | Tarsa et al. |
| 8,729,589 B2 | 5/2014 | Hussell et al. |
| 8,866,410 B2 | 10/2014 | Negley et al. |
| 8,940,561 B2 | 1/2015 | Donofrio et al. |
| 8,970,131 B2 | 3/2015 | Brandes et al. |
| 9,024,349 B2 | 5/2015 | Chitnis et al. |
| 9,054,257 B2 | 6/2015 | Chan et al. |
| 9,131,561 B2 | 9/2015 | Athalye |
| 9,159,888 B2 | 10/2015 | Chitnis et al. |
| 9,277,605 B2 | 3/2016 | Ni |
| 9,414,454 B2 | 8/2016 | Brandes et al. |
| 9,735,198 B2 | 8/2017 | Joo et al. |
| 2003/0151361 A1* | 8/2003 | Ishizaka .............. H01L 33/44 313/512 |
| 2004/0069993 A1 | 4/2004 | Murano |
| 2005/0184387 A1 | 8/2005 | Collins, III et al. |
| 2006/0145172 A1 | 7/2006 | Su et al. |
| 2006/0157722 A1 | 7/2006 | Takezawa et al. |
| 2006/0198162 A1* | 9/2006 | Ishidu ................ H01L 33/60 362/623 |
| 2006/0221272 A1 | 10/2006 | Negley et al. |
| 2006/0261364 A1 | 11/2006 | Suehiro et al. |
| 2007/0104828 A1 | 5/2007 | Fornaguera |
| 2007/0161211 A1 | 7/2007 | Sunohara et al. |
| 2007/0178629 A1 | 8/2007 | Ogawa et al. |
| 2007/0228387 A1 | 10/2007 | Negley et al. |
| 2007/0268694 A1* | 11/2007 | Bailey ............... G02B 27/0955 362/231 |
| 2008/0224608 A1 | 9/2008 | Konishi et al. |
| 2008/0233666 A1* | 9/2008 | Park ..................... H01L 33/60 438/27 |
| 2008/0258130 A1 | 10/2008 | Bergmann et al. |
| 2009/0050908 A1 | 2/2009 | Yuan et al. |
| 2009/0057690 A1 | 3/2009 | Chakraborty |
| 2009/0108281 A1 | 4/2009 | Keller et al. |
| 2009/0115313 A1 | 5/2009 | Lu et al. |
| 2009/0146176 A1 | 6/2009 | Oishi |
| 2009/0230409 A1 | 9/2009 | Basin et al. |
| 2010/0155763 A1 | 6/2010 | Donofrio et al. |
| 2010/0237375 A1 | 9/2010 | Yamazaki et al. |
| 2010/0252851 A1 | 10/2010 | Emerson et al. |
| 2010/0258830 A1 | 10/2010 | Ide et al. |
| 2011/0006334 A1 | 1/2011 | Ishii et al. |
| 2011/0031524 A1 | 2/2011 | Pei |
| 2011/0068702 A1 | 3/2011 | van de Ven et al. |
| 2011/0079801 A1 | 4/2011 | Zhang et al. |
| 2011/0140148 A1* | 6/2011 | Liu ..................... H01L 33/58 257/98 |
| 2011/0316024 A1 | 12/2011 | Hung et al. |
| 2012/0153340 A1 | 6/2012 | Song et al. |
| 2012/0305949 A1 | 12/2012 | Donofrio et al. |
| 2012/0319150 A1 | 12/2012 | Shimomura et al. |
| 2013/0193468 A1 | 8/2013 | Hussell et al. |
| 2013/0207141 A1* | 8/2013 | Reiherzer ............ H01L 33/505 257/98 |
| 2013/0256711 A1* | 10/2013 | Joo .................... H01L 33/486 257/88 |
| 2013/0264589 A1* | 10/2013 | Bergmann .......... H01L 33/507 257/88 |
| 2013/0270592 A1 | 10/2013 | Reiherzer et al. |
| 2013/0279169 A1 | 10/2013 | Reiherzer et al. |
| 2013/0307013 A1 | 11/2013 | Chan et al. |
| 2013/0334959 A1* | 12/2013 | Wang ................ H01L 51/5256 313/512 |
| 2014/0070235 A1 | 3/2014 | Andrews et al. |
| 2014/0153238 A1* | 6/2014 | Nishimura .......... H01L 25/0753 362/237 |
| 2014/0346545 A1 | 11/2014 | Chan et al. |
| 2014/0367713 A1 | 12/2014 | Zhang et al. |
| 2015/0049510 A1 | 2/2015 | Haiberger et al. |
| 2015/0257211 A1 | 9/2015 | Johnson et al. |
| 2016/0293811 A1 | 10/2016 | Hussell et al. |
| 2017/0345866 A1 | 11/2017 | Joo et al. |
| 2018/0076368 A1 | 3/2018 | Hussell |

FOREIGN PATENT DOCUMENTS

| | | |
|---|---|---|
| JP | H10-247748 A | 9/1998 |
| JP | 2000-022218 | 1/2000 |
| JP | 2001-160630 | 6/2001 |
| JP | 2006-093435 | 4/2006 |
| JP | 2007-189006 | 7/2007 |
| JP | 2009-146935 | 7/2009 |
| KR | 10-0829910 | 5/2008 |
| KR | 10-0933920 | 12/2009 |
| KR | 10-2010-0008509 | 1/2010 |
| KR | 10-2011-0111941 | 10/2011 |
| WO | WO 2013/148823 | 10/2013 |
| WO | WO 2013/148826 | 10/2013 |
| WO | WO 2016/161161 | 10/2016 |

OTHER PUBLICATIONS

International Search Report and Written Opinion for Application No. PCT/US2013/034087 dated Jul. 25, 2013.
International Search Report and Written Opinion for Application No. PCT/US2013/035411 dated Oct. 15, 2013.
Restriction Requirement for U.S. Appl. No. 13/834,195 dated Jul. 21, 2014.
Non-Final Office Action for U.S. Appl. No. 13/834,195 dated Nov. 19, 2014.
Final Office Action for U.S. Appl. No. 13/834,195 dated Mar. 6, 2015.
Non-Final Office Action for U.S. Appl. No. 13/834,195 dated Feb. 26, 2016.
Final Office Action for U.S. Appl. No. 13/834,195 dated Jun. 23, 2016.
International Search Report and Written Opinion for Application No. PCT/US2016/025346 dated Aug. 2, 2016.
Notice of Publication for Application No. PCT/US2016/025346 dated Oct. 6, 2016.
Non-Final Office Action for U.S. Appl. No. 13/834,195 dated Nov. 28, 2016.
Notice of Allowance for U.S. Appl. No. 13/834,195 dated Apr. 11, 2017.
Notice of Allowance for U.S. Appl. No. 13/834,195 dated Jun. 22, 2017.
Restriction Requirement for U.S. Appl. No. 15/087,641 dated Nov. 20, 2017.

(56) References Cited

OTHER PUBLICATIONS

Notice of Publication for U.S. Appl. No. 15/676,965 dated Mar. 15, 2018.
Restriction Requirement for U.S. Appl. No. 15/676,961 dated May 7, 2018.
Non-Final Office Action for U.S. Appl. No. 15/676,961 dated Aug. 30, 2018.
Final Office Action for U.S. Appl. No. 15/676,961 dated Jan. 18, 2019.
Non-Final Office Action for U.S. Appl. No. 15/676,961 dated Jul. 25, 2019.

* cited by examiner

| Product | Lf typ 350mA/ 85C | package size (mm) | footprint ratio | Lumen density (lm/mm^2) |
|---|---|---|---|---|
| XD12 | 148 | 1.2 x 1.2 | 0.694 | 242 |
| XD14 | 151 | 1.4 x 1.4 | 0.675 | 254 |
| XD16 | 157 | 1.6 x 1.6 | 0.766 | 213 |
| XD22 | 162 | 2.2 x 2.2 | 0.786 | 274 |

LED APPARATUSES AND METHODS FOR HIGH LUMEN OUTPUT DENSITY

TECHNICAL FIELD

The present subject matter relates generally to light emitting devices, systems, and/or methods. More particularly, the subject matter disclosed herein relates to light emitter devices and methods delivering a high lumen output density.

BACKGROUND

Light emitting diodes or "LEDs" are solid state devices that convert electrical energy into light and are often used as replacements for incandescent or fluorescent lighting. LED devices provide advantages over historical lighting methods by providing bright light combined with comparably lower power. As LED technology has improved, the emitted light has become brighter through a variety of approaches. Despite these improvements, there remains a continued desire to increase the brightness of LED devices while decreasing allotted space or size of a device. This quality can be referred to as the "lumen density" or "luminous flux density" of a device, which can be measured, for example, in lumens per square millimeter ($lm/mm^2$).

SUMMARY

Substrate based LEDs and related methods having improved reliability and performance are provided and described herein. Devices, components, and methods described herein can advantageously exhibit improved processing times, ease of manufacture, and/or lower processing costs. Devices, components, and related methods described herein are well suited for a variety of applications such as personal, industrial, and commercial lighting applications including, for example, light bulbs and light fixture products and/or applications. In some aspects, devices, components, and related methods described herein can comprise improved LED manufacturing processes and/or improved optical properties including improved light output, contrast, and more consistent and uniform light emission and color. Such devices can be less expensive and more efficient.

In some aspects, an LED apparatus can have a substrate, one or more LEDs, and a light-transmissive encapsulation material disposed over the LEDs, where the apparatus is configured to emit light with a lumen output density of at least 200 lumens per square mm ($lm/mm^2$).

In another aspect, an LED apparatus can have a substrate, one or more LEDs, and a light-transmissive encapsulation material disposed over the LEDs, where the top surface of the encapsulation material is flat and has beveled recesses disposed in the top surface to improve the brightness of the emitted light.

In another aspect, an LED apparatus can have a substrate with electrical vias connecting upper and lower surfaces of the substrate, and one or more LEDs positioned such that all of the vias are disposed under the area where an LED is located.

BRIEF DESCRIPTION OF THE DRAWINGS

A full and enabling disclosure of the present subject matter is set forth more particularly in the remainder of the specification, including reference to the accompanying example figures, relating to one or more embodiments, in which.

DETAILED DESCRIPTION

Figure 1A:
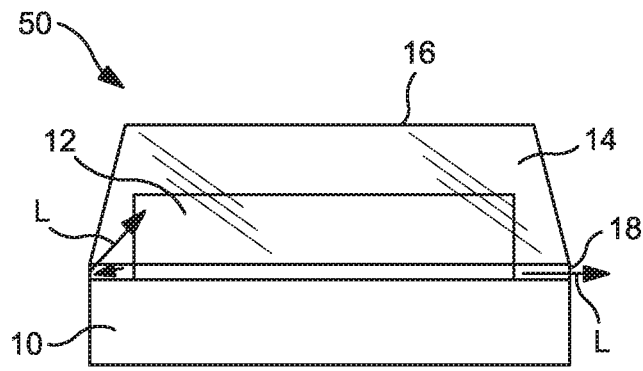
FIG. 1A is a side view of an embodiment of an LED apparatus according to prior art.

In some aspects, solid state lighting apparatuses, LED devices and/or systems, and methods for producing the same, described herein can comprise various solid state light emitter electrical configurations, color combinations, and/or circuitry components for providing solid state lighting apparatuses having improved efficiency, improved emission profiles, enhanced output and/or optimized color production. Apparatuses and methods such as those disclosed herein advantageously cost less, are more efficient, vivid, uniform, and/or brighter than some other solutions.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to sectional, perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

Unless the absence of one or more elements is specifically recited, the terms "comprising", "including", and "having" as used herein should be interpreted as open-ended terms that do not preclude the presence of one or more elements. Like numbers refer to like elements throughout this description.

It will be understood that when an element such as a layer, region, or substrate is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter(s)" and "emitter (s)" as used herein are synonymous terms and refer to any device capable of producing visible or near visible (e.g., from infrared to ultraviolet) wavelength radiation, including for example but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LEDs are electrically connected, such as in series, in parallel, in mixed series/parallel, in common anode, or in common anode configurations among mutually exclusive groups/segments/sets. The segments of LEDs can be configured in a number of different ways and may have circuits of varying functionality associated therewith (e.g. driver circuits, rectifying circuits, current limiting circuits, shunts, bypass circuits, etc.), as discussed, for example, in commonly assigned and co-pending U.S. patent application Ser. No. 12/566,195, filed on Sep. 24, 2009, U.S. patent application Ser. No. 13/769,273, filed on Feb. 15, 2013, U.S. patent application Ser. No. 13/769,277 filed on Feb. 15, 2013, U.S. patent application Ser. No. 13/235,103, filed on Sep. 16, 2011, U.S. patent application Ser. No. 13/235,127, filed on Sep. 16, 2011, and U.S. Pat. No. 8,729,589, which issued on May 20, 2014, the disclosure of each of which is hereby incorporated by reference herein in the entirety.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

Apparatuses, systems, and methods as disclosed herein can utilize red chips, green chips, and blue chips. In some aspects, chips for use in blue-shifted yellow light (BSY) devices can target different bins as set forth in Table 1 of commonly owned, assigned, and co-pending U.S. patent application Ser. No. 12/257,804, published as U.S. Pat. Pub. No. 2009/0160363, the disclosure of which is incorporated by reference herein in the entirety. Apparatuses, systems, and methods herein can utilize, for example, ultraviolet (UV) chips, cyan chips, blue chips, green chips, red chips, amber chips, and/or infrared chips.

The term "substrate" as used herein in connection with lighting apparatuses refers to a mounting member or element on which, in which, or over which, multiple solid state light emitters (e.g., LEDs) can be arranged, supported, and/or mounted. A substrate can be, e.g., a component substrate, a chip substrate (e.g., an LED substrate), or a sub-panel substrate. Exemplary substrates useful with lighting apparatuses as described herein can for example comprise printed circuit boards (PCBs) and/or related components (e.g., including but not limited to metal core printed circuit boards (MCPCBs), flexible circuit boards, dielectric laminates, ceramic based substrates, and the like), ceramic or metal boards having FR4 and/or electrical traces arranged on one or multiple surfaces thereof, high reflectivity ceramics (e.g., alumina) support panels, and/or mounting elements of various materials and conformations arranged to receive, support, and/or conduct electrical power to solid state emitters. Electrical traces described herein provide electrical power to the emitters for electrically activating and illuminating the emitters. Electrical traces may be visible and/or covered via a reflective covering, such as a solder mask material, Ag, or other suitable reflector.

In some embodiments, one substrate can be used to support multiple groups of solid state light emitters in addition to at least some other circuits and/or circuit elements, such as a power or current driving components and/or current switching components. In other aspects, two or more substrates (e.g., at least a primary substrate and one or more secondary substrate or substrates) can be used to support multiple groups of solid state light emitters in addition to at least some other circuits and/or circuit elements, such as a power or current driving components and/or temperature compensation components. The first and second (e.g., primary and secondary) substrates can be disposed above and/or below each other and along different planes, adjacent (e.g., side-by-side) to each other, have one or more co-planar surfaces disposed adjacent each other, arranged vertically, arranged horizontally, and/or arranged in any other orientation with respect to each other.

LEDs useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (without or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit light to stimulate emissions of one or more lumiphoric materials (e.g., phosphors, scintillators, lumiphoric inks, quantum dots), and generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by powder coating, inkjet printing, or the like), adding such materials to lenses, and/or by embedding or dispersing such materials within lumiphor support elements or surfaces. Methods for fabricating LEDs having a planarized coating of phosphor integrated therewith are discussed by way of example in U.S. Patent Application Publication No. 2008/0179611, filed on Sep. 7, 2007, to Chitnis et al., the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LEDs of different colors, one or more of which can be white emitting (e.g., including at least one LED with one or more lumiphoric materials).

In some aspects, one or more short wavelength solid state emitters (e.g., blue and/or cyan LEDs) can be used to stimulate emissions from a mixture of lumiphoric materials, or discrete layers of lumiphoric material, including red, yellow, and green lumiphoric materials. LEDs of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600,175, issued on Jul. 29, 2003, and U.S. Patent Application Publication No. 2009/0184616, filed on Oct. 9, 2008, each disclosure of which is hereby incorporated by reference herein in the entirety), are well-known and available to persons of skill in the art.

In some aspects, lighting apparatuses and systems as described herein comprise multiple sets of solid state light emitters targeting different colors (e.g., one set targeting a first color and at least a second set targeting a second color that is different than the first color). In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted by another set of solid state emitters). Aspects of targeting and selectively activating sets of solid state emitters according to the present subject matter may be provided using the circuitry and/or techniques described in commonly assigned and co-pending U.S. patent application Ser. No. 14/221,839, the disclosure of which was previously incorporated hereinabove by reference.

The term "color" in reference to a solid state emitter refers to the color and/or wavelength of light that is emitted by the chip upon passage of electrical current therethrough.

Some embodiments of the present subject matter may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611; 2008/0173884; 2008/0121921; 2008/0012036; 2007/0253209; 2007/0223219; 2007/0170447; 2007/0158668; 2007/0139923, and/or 2006/0221272; U.S. patent application Ser. No. 11/556,440, filed on Dec. 4, 2006; with the disclosures of the foregoing patents, published patent applications, and patent application serial numbers being hereby incorporated by reference as if set forth fully herein.

The terms "lighting apparatus" and "module" as used herein are synonymous, and are not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage (e.g., road signs, a billboard), a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, spotlighting, high-bay lighting, low-bay lighting, or any other light emitting device.

Phosphor and phosphor compounds as disclosed herein can in some aspects comprise one or more of a wide variety of wavelength conversion materials or color conversion components including luminescent materials. Examples of luminescent materials (lumiphors) include phosphors, Cerium-doped Yttrium Aluminum Garnet (YAG) (e.g. LuAG:Ce), Nitrides, Oxy-Nitrides, scintillators, day glow tapes, nanophosphors, quantum dots (e.g., such as provided by NNCrystal US Corp., Fayetteville, Ark.), and inks that glow in the visible spectrum upon illumination with (e.g., ultraviolet) light, inclusion of lumiphors in wavelength conversion components or related components as disclosed herein, in conjunction with solid state light emitters and LEDs, can be accomplished by providing layers (e.g., coatings) of such materials over solid state emitters and/or by dispersing luminescent materials to a clear encapsulant (e.g., epoxy-based or silicone-based curable resin or other polymeric matrix) arranged to cover or partially cover one or more solid state light emitters. One or more luminescent materials useable in devices as described herein may be down-converting or up-converting, or can include a combination of both types.

Wavelength conversion materials can provide benefits including, for example, improved long term reliability (e.g., improved properties at around 1000 hours or more and 85° C., 105° C., and/or 125° C.), decreased bubbling around solid state light emitters, a larger viewing angle, lower dCCT color spread, cooler phosphor temperatures, brighter light emission, improved sulfur resistance, and/or a smaller color point spread, including all or any combination of such features.

The presently disclosed subject matter is directed to embodiments of LED structures having a light source that comprises LEDs. The LED packages can be arranged in different ways and are relatively small, while at the same time are efficient, reliable and cost effective. The embodiments according to the disclosure herein can have different shaped encapsulants, and can emit light with improved or similar efficiency compared to similar LED packages with fully hemispheric encapsulants. In some embodiments where a plurality of LEDs are mounted on a substrate, the spacing between each LED chip can be controlled to optimize the intensity of light output from the LED package. The LED packages according to the disclosure herein can also be smaller and less expensive to manufacture.

The disclosure herein is described with reference to example embodiments, but it is understood that the disclosure herein can be embodied in many different forms and should not be construed as limited to the embodiments set forth herein. In particular, the disclosure herein is described below in regards to certain LED apparatuses having LEDs in different configurations, but it is understood that the disclosure herein can be used for many other LED packages with other LED configurations. LED packages using the disclosure herein can also have many different shapes beyond those described below, such as rectangular, and the solder pads and attach pads can be arranged in many different ways. In other embodiments, the emission intensity of the different types of LEDs can be controlled to vary the overall LED package emission.

The embodiments described herein are with reference to an LED or LEDs, but in accordance with the disclosure herein and in some aspects LEDs as used herein can include LED chips or any other suitable structure or structures. For example, LEDs as used herein can be individual junctions of a monolithic LED. For example, instead of being completely separate LED chips, the LEDs can each be a LED region all on a common substrate that can have different types of monolithic junctions. A mesa between the LEDs and on the common substrate can extend to certain layers or can extend all the way to or from the common substrate. Therefore, a monolithic LED can comprise more than one LED junctions on a common substrate, and the gaps between the LEDs can be formed by the mesas that can at least partially separate the LEDs.

The components described herein can have different shapes and sizes beyond those shown, and one or different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package. In multiple LED packages, the LEDs can be serially interconnected or can be interconnected in different serial and parallel combinations.

Coatings, encapsulants, encapsulant layers, and the like are disclosed herein and can comprise any material that provides mechanical, chemical, and/or environmental protection to a substrate, reflective layer, or other LED component. A coating, encapsulant and/or encapsulant layer can be configured in some embodiments as a layer that covers a substantially horizontal or vertical surface, and in some aspects can comprise a layer disposed on top of another layer, surface or structure whether or not it fully surrounds all sides of the other layer, surface or structure. In some embodiments a coating, encapsulant and/or encapsulant layer can comprise or consist of a dielectric as disclosed herein. It is also understood that when an feature or element such as a layer, region, encapsulant or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Embodiments of the present disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances are expected. Embodiments of the disclosure should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the disclosure herein.

Coating materials disclosed herein can in some aspects comprise a number of encapsulating layers, coatings and/or dielectric materials and compounds, including for example silicon oxide, silicon nitride, aluminum oxide, titanium dioxide, non-metallic oxides, non-metallic nitrides, tantalum oxide, aluminum, nickel, titanium, tungsten, platinum, combinations thereof or alloys thereof, etc. In some aspects such encapsulants, coatings and/or dielectrics can comprise one or more materials arranged to provide desired electrical isolation and high thermal conductivity. For example, a dielectric can provide a desired electrical isolation between electrical traces and/or sets of solid state emitters. In some aspects, such substrates can comprise ceramic such as alumina ($Al2O3$), aluminum nitride (AlN), silicon carbide (SiC), silicon, or a plastic or polymeric material such as polyimide, polyester, metal, etc.

It is known in the art that the brightness of an LED device or apparatus can depend in part on the geometric shape of the overall package. LED devices often comprise a substrate, one or more light emitting diodes, and an encapsulant covering the diode(s) and substrate. Devices having the same diode but differently shaped encapsulants can emit different amounts of light. For example, domed encapsulants are sometimes preferred over flat encapsulants due to improved light output from an otherwise identical LED. One reason for this is that the flat outer surface can create internal reflections, leading to losses in emitted light. At the same time, however, a domed encapsulant can have the drawback of an increased package size. Disclosed herein are LED apparatuses or devices that are particularly useful for increasing the lumen density of emitted light in comparably smaller packages, in particular those having a substantially flat encapsulant.

Referring to FIG. 1A, a prior art LED device generally designated 50 can have a substrate 10 one or more LEDs 12, and an encapsulant 14. Encapsulant 14 can be applied in a number of ways, such as for example by dispensing it, depositing it, or molding it. LED device 50 can have a substantially square footprint. Encapsulant 14 can be disposed on the surface of substrate 11 such that it covers both the surface of substrate 10 as well as LED 12, with a substantially flat upper surface 16. In some conventional LED devices, encapsulant 14 does not form a sharp edge with the base of substrate 12. This can be attributed to manufacturing anomalies such as "flash" or molding errors, resulting in surface 18. These additional, unwanted surfaces can lead to light reflecting in undesirable directions, shown by light rays L. Light L can be subject to multiple redirections within encapsulant 14, which can lead to detrimental effects such as attenuation of overall light output and/or emitted light visibility in undesired areas, such as along surface 18.

Figure 1B:
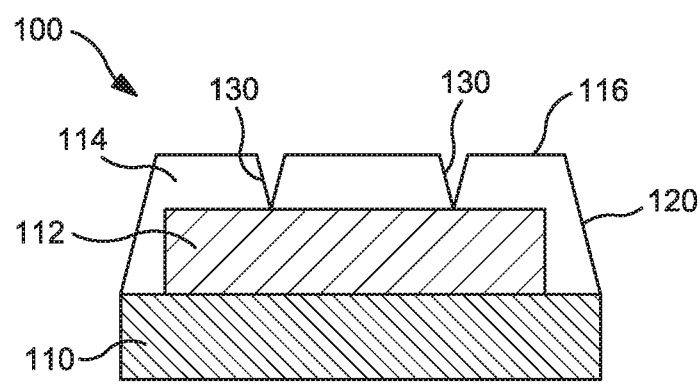
FIG. 1B is a cross-sectional side view of an LED apparatus according to the disclosure herein.
Figure 1C:
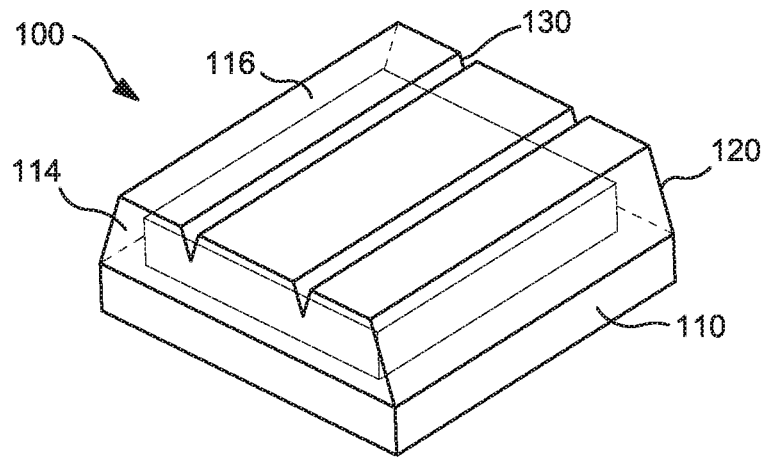
FIG. 1C is a perspective view of an LED apparatus according to the disclosure herein.

By controlling the geometry of an LED device, the brightness of the emitted light in the desired direction can be increased. This can be accomplished in several ways. For example, and in accordance with aspects of the disclosure herein such as illustrated in FIGS. 1B and 1C, an LED device generally designated 100 can have a substrate 110, one or more LEDs such as LED 112, and an encapsulant 114. LED device 100 can have a substantially square footprint. Encapsulant 114 can be disposed on the surface of substrate 110 such that it covers both the surface of substrate 110 as well as LED 112 and have a substantially flat upper surface 116. The peripheral walls of encapsulant 114 can be disposed at an angle to the surface of substrate 110, which can be referred to as bevel 120. The base of bevel 120 can terminate at a point coincident with the edge of substrate 110. This facilitates light transmission through encapsulant 114 rather than reflection by eliminating unwanted surfaces.

In addition to bevel 120, LED device 100 can also have facets 130 in the top surface of the encapsulant in a region above LEDs 112. Like bevel 120, facets 130 alter the angle of incidence of the emitted light, promoting transmission from encapsulant 114 rather than internal reflection. Facets 130 can have, for example and without limitation, a V-shaped cross section and progress linearly along encapsulant 114. This creates surfaces above LED 112 having a more advantageous striking angle, which promotes light transmission from encapsulant 114 in a preferred direction.

Figure 2A:
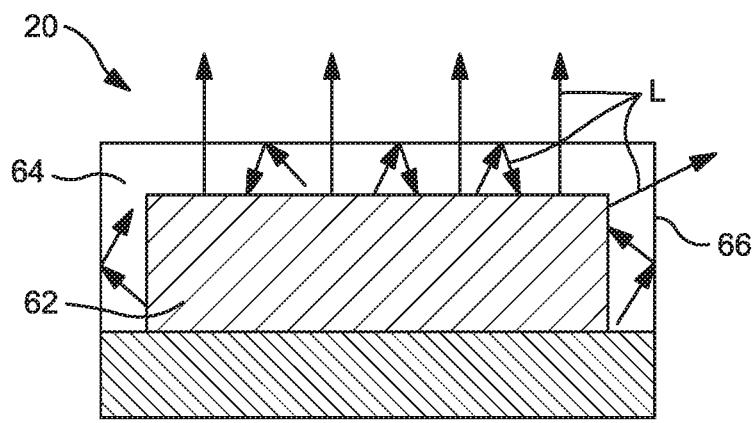
FIG. 2A is a cross-sectional side view of an LED apparatus according to prior art.
Figure 2B:
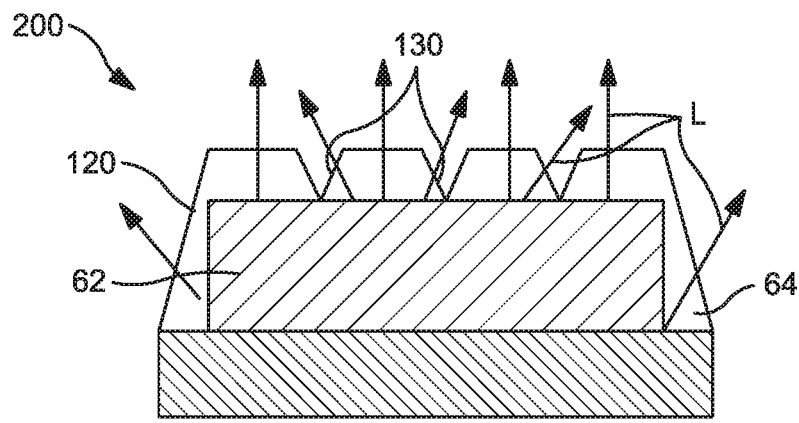
FIG. 2B is a cross-sectional side view of an LED apparatus according to the disclosure herein.

Referring to FIGS. 2A and 2B, the improvements to light transmission are further illustrated. FIG. 2A depicts a prior art LED device 20 comprising LED 62 with a conventional encapsulant or molding 64 that has perpendicular sides 66. Light rays L can experience an amount of internal reflection, which can cause scattering of the light outside the desired viewing angle and reduced brightness.

Figure 2C:
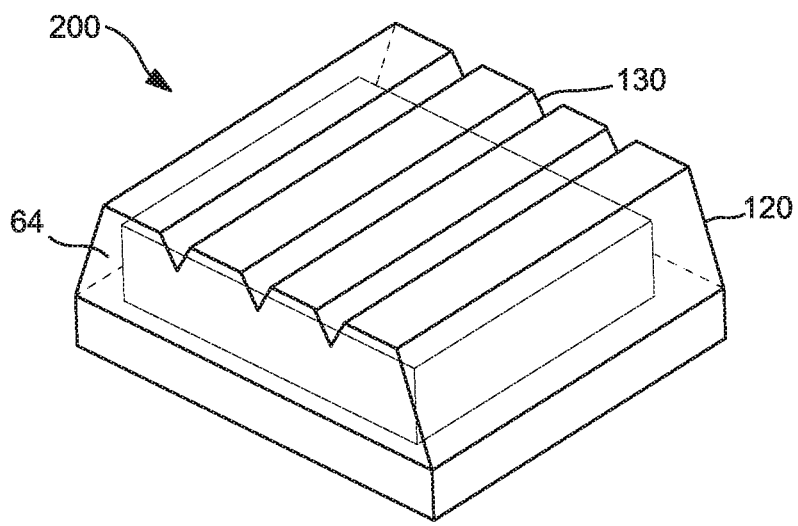
FIG. 2C is a perspective view of an LED apparatus according to the disclosure herein.

In FIGS. 2B and 2C, and in accordance with aspects of the disclosure herein, LED device generally designated 200 is depicted with the same LED 62. Encapsulant 64 has been modified to add bevel 120 and facets 130. Light rays L now strike the exterior surfaces of encapsulant 64 at a higher angle, making them more likely to be transmitted through the medium and resulting in a brighter light in a desired viewing area.

Figure 3A:
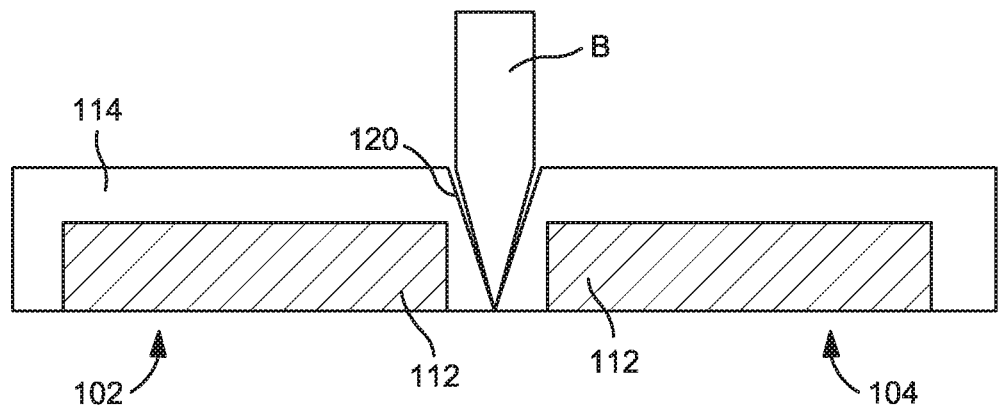
FIGS. 3A-3B are cross-sectional illustrations of steps of a method for producing an LED apparatus according to the disclosure herein.
Figure 3B:
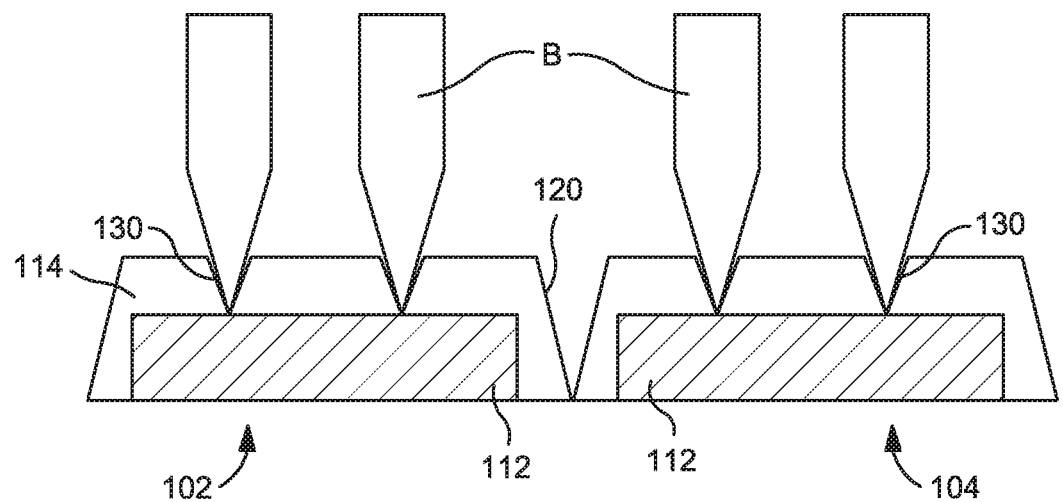

Referring to FIGS. 3A-3B, steps of a method of creating bevel 120 are illustrated. Bevel 120 can be produced by a variety of approaches, for example, as is shown in FIG. 3A. A beveled blade B can be used to create bevel 120 before, during, or after singulation by removing material from encapsulant 114. Beveled blade B can be used, for example, to at least partially of completely separate LED devices generally designated 102, 104 and at the same time create bevel 120. Modification of encapsulant 114 by cutting with beveled blade B provides a benefit of a clean, controlled edge, further increasing the amount of desired emitted light and reducing undesirable light losses through molding flash or other imperfections. Similarly, facets 130 can be created by modifying encapsulant 114 in a region above LEDs 112. In some aspects, beveled blade B can be 200 um (0.008") wide, with a 45° beveled and notched blade.

Figure 4A:
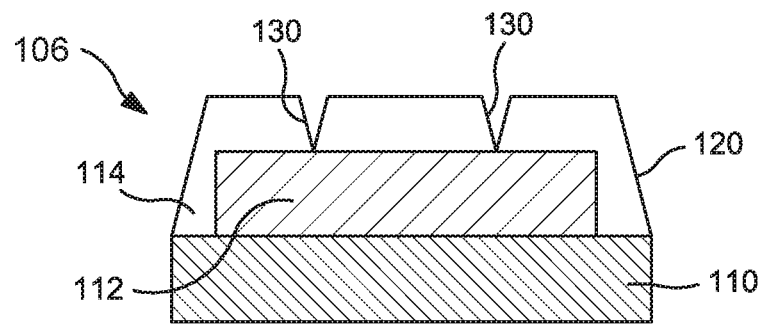
FIGS. 4A-4B are cross-sectional views of another embodiment of an LED apparatus according to the disclosure herein.
Figure 4B:
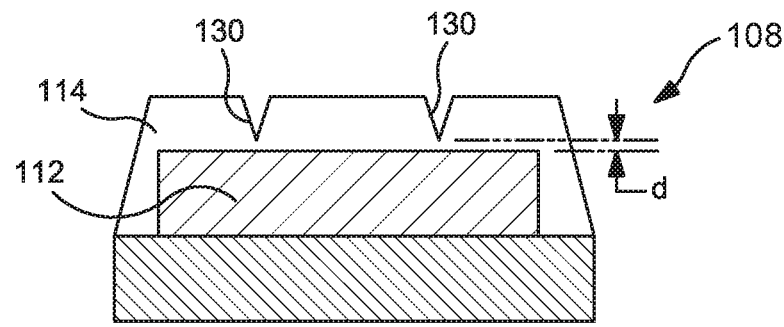

The depth of facet 130 can be variably selected. In some embodiments, such as is shown in FIG. 4A, LED device 106 can have facets 130 disposed such that they are coincident with a top surface of LED 112. In other embodiments, such as shown in FIG. 4B, LED device 108 can have facets 130 that terminate at a distance d above LED 112.

Figure 5A:
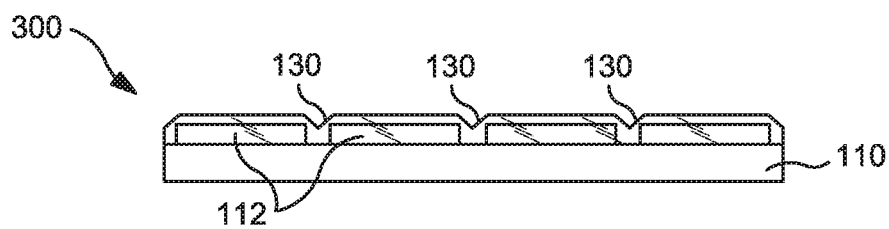
FIG. 5A-5B are top and side views, respectively, of an LED apparatus according to the disclosure herein.
Figure 5B:
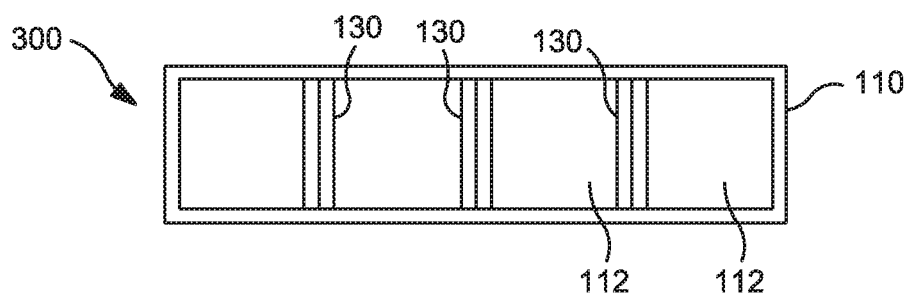

Referring to FIGS. 5A-5B, an embodiment comprising multiple LEDs is shown. The use of facets and bevels is not limited to LED devices having a single chip; for example, an LED device can comprise a plurality of LEDs 112 arranged in a linear or rectangular pattern. FIGS. 5A-5B show side and top views, respectively, of an LED device generally designated 300 with a 4×1 array of LEDs. LED device 300 has facets 130 disposed between each of LEDs 112. Other array configurations are also possible, such as 3×1, 5×5, etc. LED devices having multiple chips can furthermore comprise an array of chips with either different colors or a same color.

Figures 6, 7:
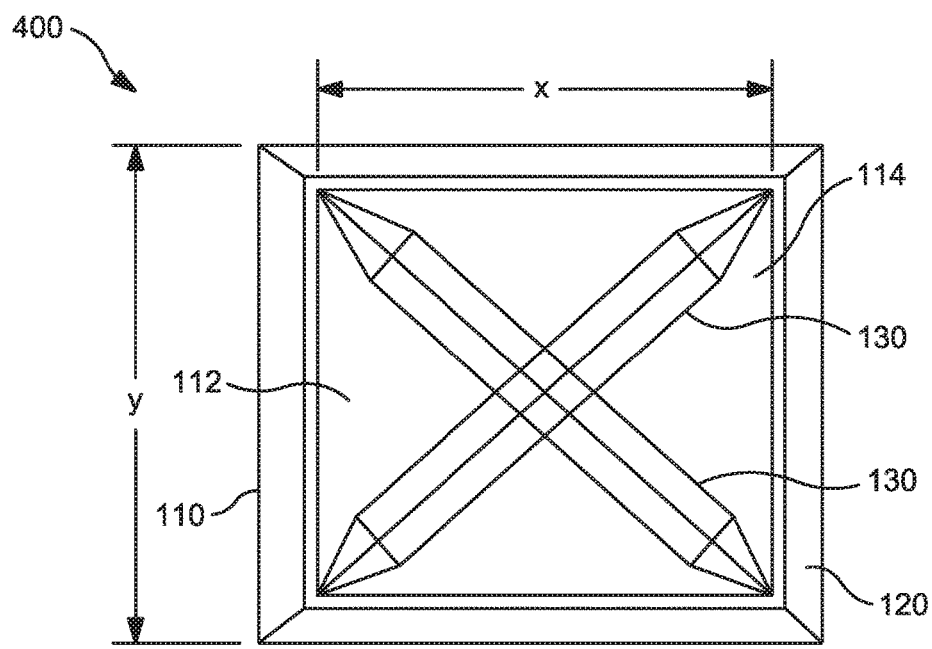
FIG. 6 is a top view of another embodiment of an LED apparatus according to the disclosure herein.
FIG. 7 is a table of experimental data according to the disclosure herein.

In an example embodiment of FIG. 6, a top view of an LED generally designated 400 is shown. Two facets 130 can be disposed in encapsulant 114, crossing one another at a 90 degree angle and extending to the corners of substrate 110. It is to be understood that other configurations can also be contemplated, such as for example, a single facet, non-crossing facets, or shortened facets that do not extend to the edge of the substrate. Likewise, the use of facets 130 is not limited to square LED packages but can also be used to improve light output in LED devices of other shapes, such as rectangular, circular, etc.

In addition to geometry features such as facets and bevels, reducing the package size of an LED device can also increase the lumen density. In particular, minimizing the surface area of substrate 110 with respect to the footprints of LED 112 can increase the lumen density. For example, referring to the example embodiment of FIG. 6, an LED device general designated 400 can have a substantially square package. The dimensions of LED 112 can be represented as length x, and the dimensions of substrate 110 can be represented as length y. The footprint ratio defined by LED area to substrate area can therefore be represented as $x^2/y^2$. In the case where there are multiple LEDs on a substrate, the chip area is defined as the sum of the footprint areas of the individual LED chips. In some embodiments, LED device 400 can have a footprint ratio of at least 0.50. In other embodiments, LED device 400 can have a chip footprint ratio of at least 0.75, and in some embodiments the chip footprint ratio can be as high as 0.90.

Figure 8A:
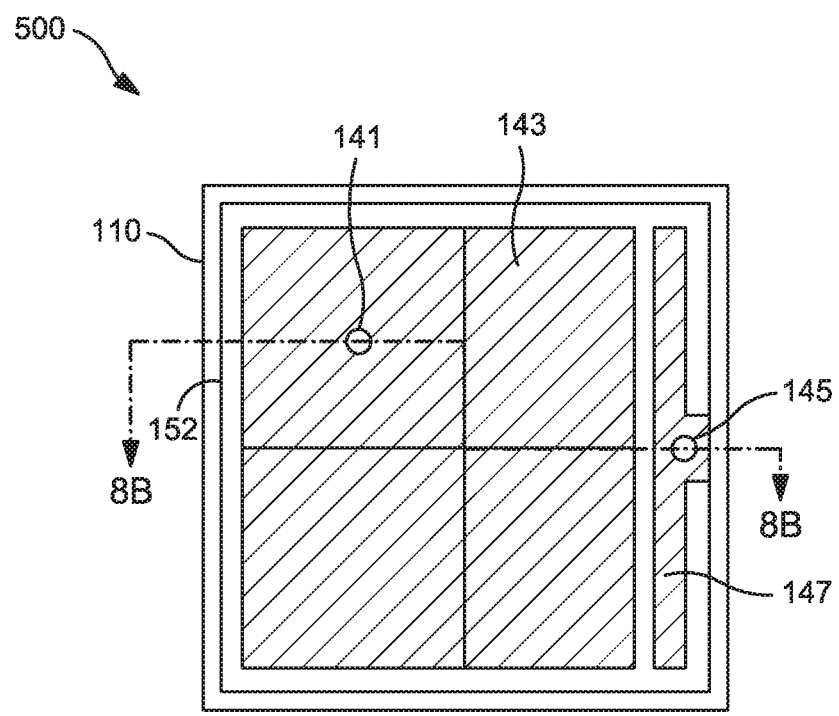
FIGS. 8A-8B are top and cross-sectional side views, respectively, of an LED apparatus according to the disclosure herein.
Figure 8B:
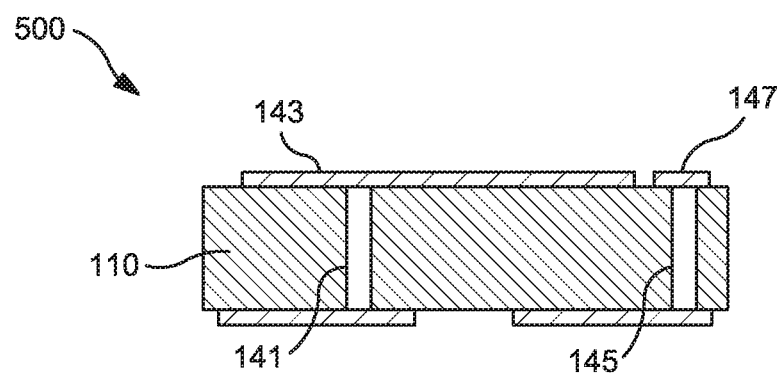

Referring to FIG. 7, experimental results for lumen density of LED devices in accordance with the features disclosed herein are provided. In particular, it can be observed that large gains in lumen density can be achieved with products having high lumens per watt output. Referring to 8A-8B, additional methods for decreasing the footprint ratio are illustrated. For example, the area required for electrical traces and mounting pads can be reduced by placing electrical vias under the LED chips. FIGS. 8A-8B show top and cross-sectional side views, respectively, of an LED device generally designated 500. Substrate 110 can have an N-side via 141 beneath N-bond pad 143, and P-side via 145 can be placed under the P-side bond pad 147. The footprint of LED 112 (not shown) is represented by square area 152. By placing electrical vias 141 and 143 under LED footprint 152, the dimensions of substrate 110 can be minimized. In other embodiments (not shown), LEDs devices comprising a plurality of LED chips can similarly achieve a high footprint ratio by placing each electrical via under each respective chip.

The aforementioned features can increase the amount of emitted light from LED devices. For example, one measure of the brightness of this emitted light is lumen density (lm/mm$^2$), which is defined as a ratio of luminous flux to the surface area of an LED device. With the disclosed features an LED device can in some aspects comprise a lumen density of at least 200 lm/mm$^2$. In some aspects, an LED device can comprise a lumen density of 250 lm/mm$^2$ or more.

While the subject matter has been has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Aspects disclosed herein can, for example and without limitation, provide one or more of the following beneficial technical effects: reduced cost of providing solid state lighting apparatuses; reduced size, volume, or footprint of solid state lighting apparatuses; improved efficiency; improved color rendering; improved thermal management; simplified circuitry; improved contrast, improved viewing angle; improved color mixing; improved reliability; and/or simplified DC or AC operability.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A light emitting diode (LED) apparatus, comprising:
    a substrate having a total upper surface area and electrical vias connecting an upper surface and a lower surface of the substrate;
    one or more LEDs disposed over the substrate such that each of the vias is disposed under and covered by a respective one of the one or more LEDs; and
    a light-transmissive encapsulant disposed over the one or more LEDs,
    wherein the LED apparatus is configured to emit light with a lumen output density of at least 200 lumens per square mm, and
    wherein a ratio of LED area to the total upper surface area of the substrate is equal to or greater than 0.50, wherein the LED area is defined by a footprint of the one or more LEDs; and
    wherein the top surface of the encapsulant comprises at least one faceted recess that extends to a depth within the encapsulant that is coincident with a top surface of the one or more LEDs.

2. The LED apparatus of claim 1, wherein a top surface of the encapsulant is substantially flat.

3. The LED apparatus of claim 1, wherein the lumen output density is at least 230 lumens per square mm.

4. The LED apparatus of claim 1, wherein the lumen output density is at least 260 lumens per square mm.

5. The LED apparatus of claim 1, wherein a ratio of LED area to the total upper surface area is equal to or greater than 0.75.

6. The LED apparatus of claim 1, wherein the one or more LEDs comprises a plurality of LEDs.

7. The LED apparatus of claim 6, wherein the plurality of LEDs are arranged in a linear array.

8. The LED apparatus of claim 6, wherein the plurality of LEDs are arranged in a rectangular array.

9. A light emitting diode (LED) apparatus, comprising:
    a substrate having a total upper surface area;
    one or more LEDs disposed over the substrate; and
    a light-transmissive encapsulant disposed over the one or more LEDs, wherein an outermost top surface of the encapsulant is substantially flat and comprises at least one faceted recess that extends to a depth within the encapsulant that is coincident with a top surface of the one or more LEDs, and
    wherein a ratio of LED area to the total upper surface area of the substrate is equal to or greater than 0.50, wherein the LED area is defined by a footprint of the one or more LEDs.

10. The LED apparatus of claim 9, further comprising beveled walls on a perimeter of the encapsulant, wherein the beveled walls are coincident with edges of the substrate.

11. The LED apparatus of claim 9, wherein the at least one faceted recess is in the form of a V-shaped linear channel.

12. The LED apparatus of claim 9, wherein a ratio of LED area to the upper surface area is equal to or greater than 0.75.

13. The LED apparatus of claim 9, wherein the one or more LEDs comprises a plurality of LEDs.

14. The LED apparatus of claim 13, wherein the plurality of LEDs are arranged in a linear array.

15. The LED apparatus of claim 13, wherein the plurality of LEDs are arranged in a rectangular array.

* * * * *